(12) United States Patent
Park

(10) Patent No.: US 8,592,678 B2
(45) Date of Patent: Nov. 26, 2013

(54) PHOTOELECTRIC CONVERSION DEVICE AND MANUFACTURING METHOD THEREOF

(75) Inventor: Do-Young Park, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 139 days.

(21) Appl. No.: 13/239,300

(22) Filed: Sep. 21, 2011

(65) Prior Publication Data

US 2012/0228732 A1 Sep. 13, 2012

(30) Foreign Application Priority Data

Mar. 7, 2011 (KR) .................. 10-2011-0019886

(51) Int. Cl.
*H01L 31/0216* (2006.01)
(52) U.S. Cl.
USPC .................. 136/256; 257/433; 257/E31.124
(58) Field of Classification Search
USPC .......... 136/252, 256, 263, 251, 259; 257/448, 257/457, 465, E31.124–E31.126, 433; 438/64
See application file for complete search history.

(56) References Cited

U.S. PATENT DOCUMENTS

| | | | | |
|---|---|---|---|---|
| 6,462,266 | B1* | 10/2002 | Kurth ........................... | 136/251 |
| 2008/0264482 | A1 | 10/2008 | Lee et al. | |
| 2010/0218815 | A1* | 9/2010 | Guha et al. .................... | 136/256 |
| 2011/0100449 | A1* | 5/2011 | Yang et al. .................... | 136/256 |
| 2011/0108104 | A1* | 5/2011 | Kim et al. ..................... | 136/256 |
| 2011/0247688 | A1 | 10/2011 | Yoon et al. | |
| 2012/0017967 | A1 | 1/2012 | Moon et al. | |
| 2012/0132273 | A1* | 5/2012 | Lee et al. ...................... | 136/256 |

FOREIGN PATENT DOCUMENTS

| | | |
|---|---|---|
| JP | 2007-250623 | 9/2007 |
| KR | 10-0654103 | 12/2006 |
| KR | 10-2010-0031469 | 3/2010 |
| KR | 10-2010-0084887 | 7/2010 |

OTHER PUBLICATIONS

KIPO Registration Determination Certificate for KR 10-2011-0019886, dated Mar. 21, 2012, 5 pages.

* cited by examiner

*Primary Examiner* — Matthew W Such
*Assistant Examiner* — Ali Naraghi
(74) *Attorney, Agent, or Firm* — Christie, Parker & Hale, LLP

(57) ABSTRACT

A photoelectric conversion device including a first substrate; a second substrate located generally opposite to the first substrate; a first grid pattern located on the first substrate, wherein the first grid pattern includes a first finger electrode; a first collector electrode spaced from the first finger electrode and extending in a direction that intersects the first finger electrode; and a first connecting electrode connecting the first finger electrode and the first collector electrode; and a second grid pattern located on the second substrate, wherein the second grid pattern includes a second finger electrode; a second collector electrode spaced from the second finger electrode and extending in a direction that intersects the second finger electrode; and a second connecting electrode connecting the second finger electrode and the second collector electrode, wherein the first connecting electrode and the second connecting electrode are arranged alternately and do not overlap each other.

12 Claims, 7 Drawing Sheets

PHOTOELECTRIC CONVERSION DEVICE AND MANUFACTURING METHOD THEREOF

CROSS-REFERENCE TO RELATED APPLICATION

This application claims the benefit of Korean Patent Application No. 10-2011-0019886, filed on Mar. 7, 2011, in the Korean Intellectual Property Office, the disclosure of which is incorporated herein in its entirety by reference.

BACKGROUND

1. Field

One or more embodiments of the present invention relate to a photoelectric conversion device and a manufacturing method thereof.

2. Description of Related Art

Recently, research has been variously conducted on photoelectric conversion devices for converting light energy into electric energy as an energy source for replacing fossil fuel. In particular, solar batteries using sunlight are attracting attention.

From among solar batteries having various operating principles, wafer-type silicon or crystalline solar batteries using p-n junctions of semiconductors are the most popular but have high manufacturing costs to form and process highly pure semiconductor materials.

Unlike silicon solar cells, dye-sensitized solar cells include a photosensitive dye that receives visible light and generates excited electrons, a semiconductor material that receives the excited electrons, and an electrolyte that reacts with electrons returning from an external circuit. The dye-sensitized solar cells have much higher photoelectric conversion efficiency than other general solar cells and thus are regarded as next-generation solar cells.

SUMMARY

One or more embodiments of the present invention include a photoelectric conversion device, the structure of which is improved to simplify a manufacturing process thereof and enhance reliability thereof, and a method of manufacturing the same.

One or more embodiments of the present invention include a photoelectric conversion device, the sealing quality of which is improved, and a method of manufacturing the same.

Additional aspects will be set forth in part in the description which follows and, in part, will be apparent from the description, or may be learned by practice of the presented embodiments.

According to one or more embodiments of the present invention, a photoelectric conversion device includes a first substrate, a second substrate disposed facing the first substrate, a first grid pattern formed on the first substrate, and a second grid pattern formed on the second substrate. The first grid pattern includes a first finger electrode; a first collector electrode disposed apart from the first finger electrode, and extending in a direction that crosses the first finger electrode; and a first connecting electrode connecting the first finger electrode and the first collector electrode. The second substrate includes a second finger electrode; a second collector electrode disposed apart from the second finger electrode, and extending in a direction that crosses the second finger electrode; and a second connecting electrode connecting the second finger electrode and the second collector electrode. The first connecting electrode and the second connecting electrode are arranged alternately not to overlap one another.

The first and second finger electrodes may extend in a first-axis direction. The first and second collector electrodes may extend in a second-axis direction that crosses the first-axis direction. The first and second connecting electrodes may extend in the first-axis direction to be connected to the first and second collector electrodes, respectively.

The first and second connecting electrodes may extend from the first and second finger electrodes, respectively, to be offset with respect to each other in opposite directions along the second-axis direction.

The first and second connecting electrodes may bend from the first and second finger electrodes, respectively, to be offset with respect to each other in opposite directions along the second-axis direction.

A first contact point between the first connecting electrode and the first collector electrode and a second contact point between the second connecting electrode and the second collector electrode may be located on different locations along the second-axis direction.

The first and second finger electrodes may be aligned with each other to overlap each other.

The first and second connecting electrodes may be wider than the first and second finger electrodes, respectively.

The first and second collector electrodes may be wider than the first and second finger electrodes, respectively.

The photoelectric conversion device may further include a sealing material extending across the first and second connecting electrodes to seal between the first and second substrates.

The first and second finger electrodes may be formed in a photoelectric conversion region surrounded by the sealing material.

The first and second collector electrodes may be formed outside a photoelectric conversion region surrounded by the sealing material.

The sealing material may include a laser-absorbing material.

According to one or more embodiments of the present invention, a method of manufacturing a photoelectric conversion device includes forming a first grid pattern on a first substrate; forming a second grid pattern on a second substrate; disposing the first and second substrates to face each other having a sealing material therebetween; fusing the sealing material between the first and second substrates by irradiating light on the first substrate; and fusing the sealing material between the first and second substrates by irradiating light on the second substrate.

The forming of the first grid pattern and the forming of the second grid pattern may include forming a first finger electrode and a second finger electrode; forming a first collector electrode and a second collector electrode disposed apart from the first and second finger electrodes and extending in a direction that crosses the first and second finger electrodes, respectively; and forming a first connecting electrode and a second connecting electrode to connect the first and second finger electrodes to the first and second collector electrodes, respectively.

The first and second connecting electrodes may be arranged alternately not to overlap one another. The first and second finger electrodes may be formed in a first-axis direction. The first and second collector electrodes may be formed in a second-axis direction that crosses the first-axis direction. The first and second connecting electrodes may extend in the first-axis direction to be connected to the first and second collector electrodes, respectively.

The first and second connecting electrodes may extend from the first and second finger electrodes to be offset with respect to each other to be offset in opposite directions along in the second-axis direction.

The first and second connecting electrodes may bend from the first and second finger electrode, respectively, to be offset with respect to each other in opposite directions along the second-axis direction.

The light may include laser beams, and the sealing material may include a laser-absorbing material.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION OF THE EMBODIMENTS

Figure 1:
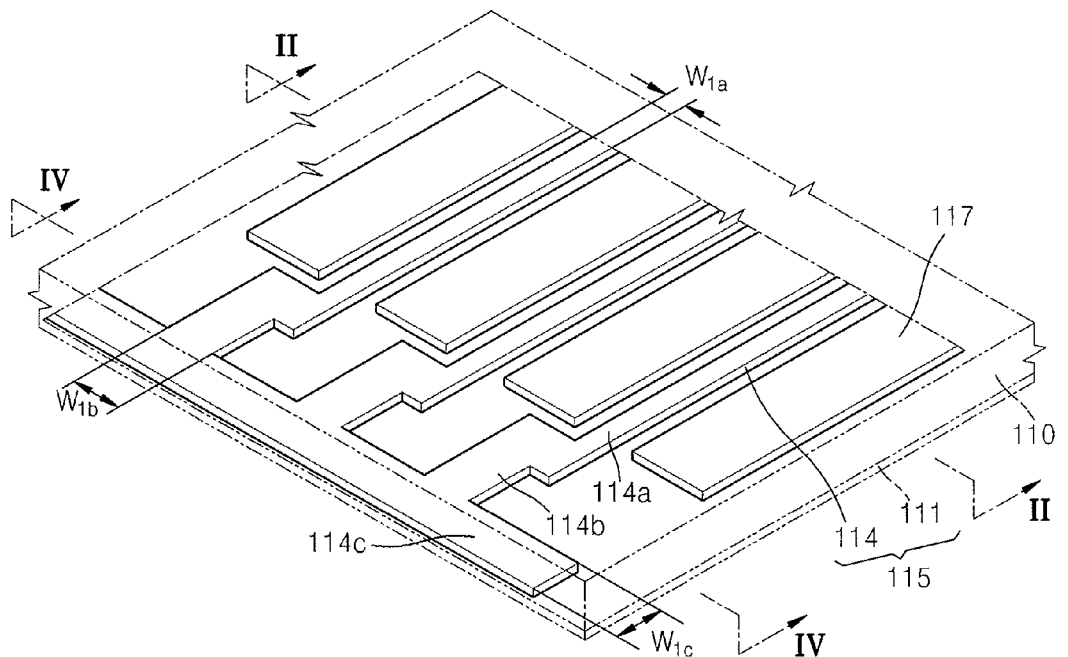
FIG. 1 is an exploded perspective view of a photoelectric conversion device according to an embodiment of the present invention.
Figure 1:
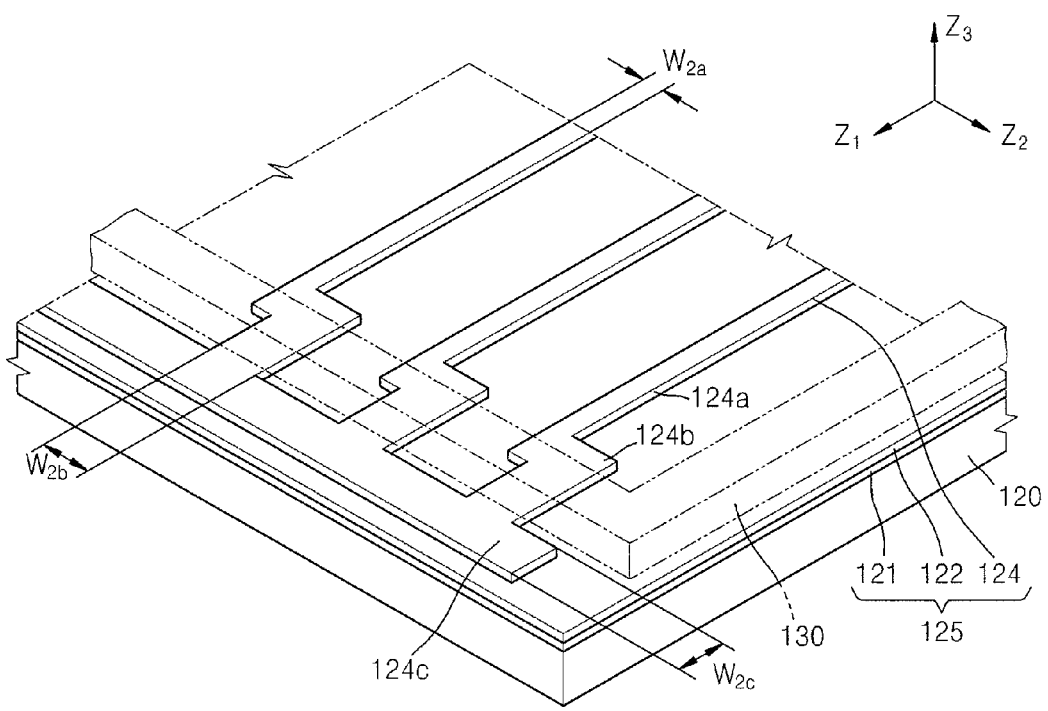

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Figure 2:
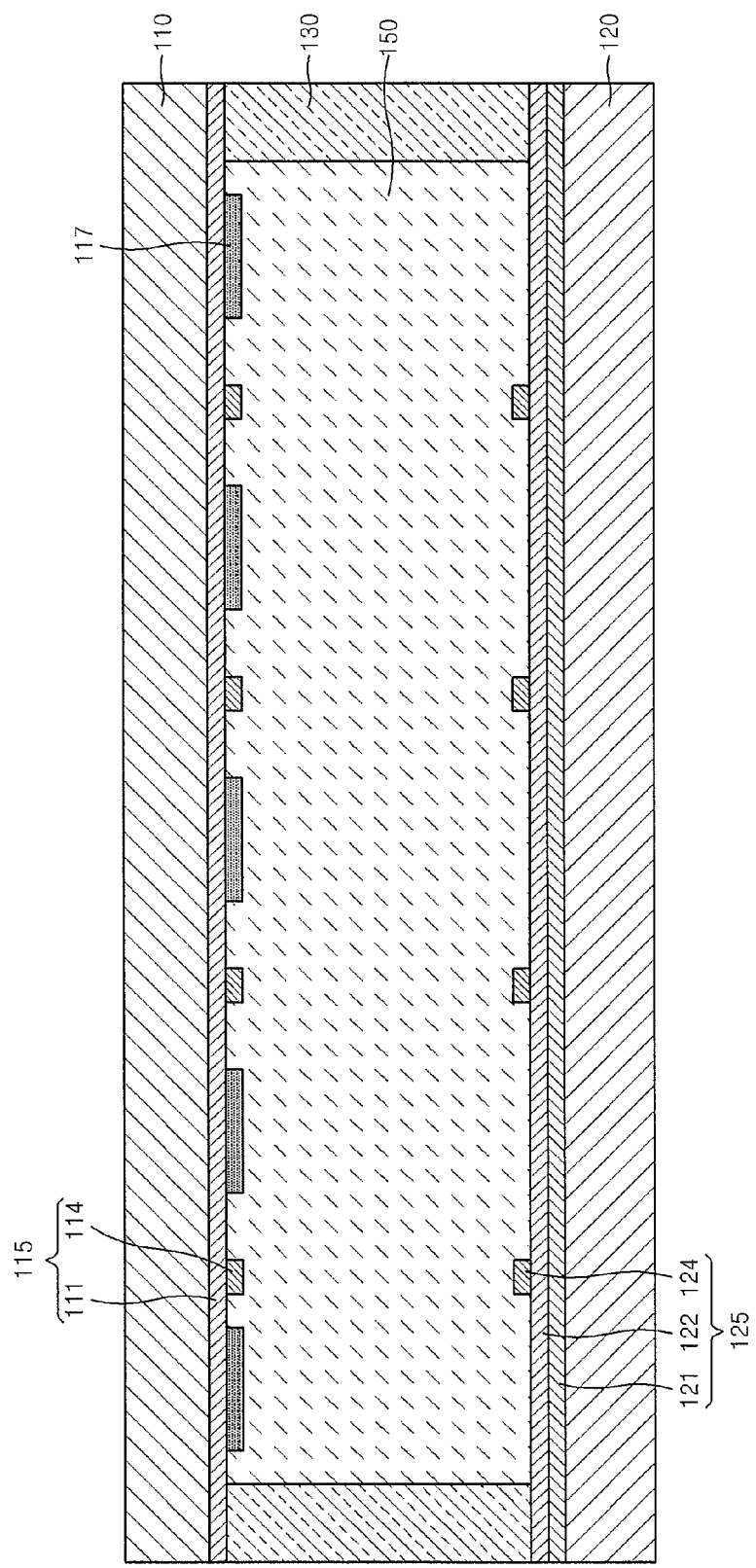
FIG. 2 is a cross-sectional view taken along the line II-II of FIG. 1.
Figure 3:
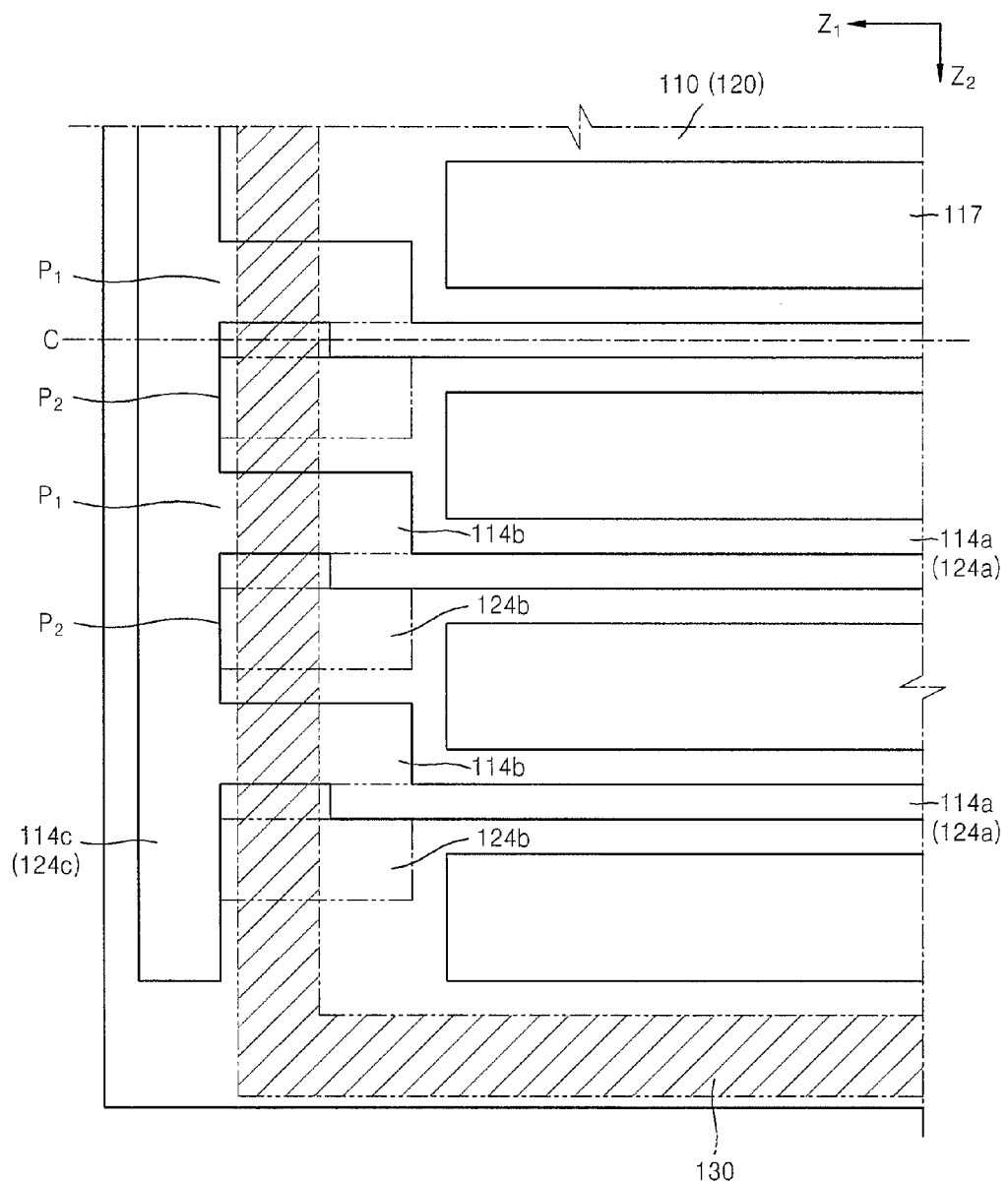
FIG. 3 is a layout diagram of first and second connecting electrodes illustrated in FIG. 1.

FIG. 1 is an exploded perspective view of a photoelectric conversion device according to an embodiment of the present invention. FIG. 2 is a cross-sectional view taken along the line II-II of FIG. 1. FIG. 3 is a layout diagram of first and second connecting electrodes 114b and 124b illustrated in FIG. 1.

Referring to FIGS. 1 to 3, a light-receiving surface (first substrate) 110 on which a photoelectrode (first electrode) 115 is formed and a counter substrate (second substrate) 120 on which a counter electrode (second electrode) 125 is formed face each other. A semiconductor layer 117 to which a photosensitive dye excited by light is adsorbed is formed adjacent to the photoelectrode 115. An electrolyte layer 150 is located between the semiconductor layer 117 and the counter electrode 125.

The light-receiving substrate 110 and the counter substrate 120 are bonded together via a sealing material 130, having a gap therebetween. The gap between the light-receiving substrate 110 and the counter substrate 120 may be filled with the electrolyte layer 150. The sealing material 130 is formed around the electrolyte layer 150 to surround the electrolyte layer 150. For example, the sealing material 130 may be formed along edges of the light-receiving substrate 110 and the counter substrate 120 to seal the electrolyte layer 150 so that an electrolyte in the electrolyte layer 150 may not leak.

The sealing material 130 may be air-tightly sealed between the light-receiving substrate 110 and the counter substrate 120 by using an external energy source. For example, the sealing material 130 may be applied around the light-receiving substrate 110 and the counter substrate 120, and may be thermally fused between the light-receiving substrate 110 and the counter substrate 120 by a laser. More specifically, the light-receiving substrate 110 and the counter substrate 120 are aligned facing each other in such a manner that the sealing material 130 is located between the edges of the light-receiving substrate 110 and the counter substrate 120. Then, the sealing material 130 is fused by irradiating a laser to the gap between the light-receiving substrate 110 and the counter substrate 120, thereby fusing the sealing material 130 between the light-receiving substrate 110 and the counter substrate 120.

The sealing material 130 may include a laser-absorbing material. For example, the sealing material 130 may be formed of a glass frit paste including the laser-absorbing material. Otherwise, the sealing material 130 may have a stacked structure of two different types of materials. For example, a glass frit paste and a glass frit paste that includes the laser-absorbing material may be stacked together to form the sealing material 130. When the sealing material 130 is fused by laser and is cooled, the sealing material 130 is adhered between the light-receiving substrate 110 and the counter substrate 120, thereby sealing the electrolyte layer 150 between the light-receiving substrate 110 and the counter substrate 120. However, the present invention is not limited thereto and the sealing material 130 may be formed according to one of other various methods.

The light-receiving substrate 110 may be formed of a transparent material, for example, a material having a high light transmittance. For example, the light-receiving substrate 110 may be formed using a glass substrate or a resin film. The resin film is generally flexible and thus may be appropriately used when flexibility is desired.

The photoelectrode 115 acts a negative electrode of the photoelectric conversion device and may have a high aperture ratio. Since light incident through the photoelectrode 115 excites the photosensitive dye adsorbed to the semiconductor layer 117, the photoelectric conversion efficiency may be increased by allowing light to be incident through the photoelectrode 115 as much as possible.

The photoelectrode 115 may include a transparent conductive layer 111 and a first grid pattern 114 formed on the transparent conductive layer 111. The transparent conductive layer 111 is formed of a material having transparency and electric conductivity, for example, a transparent conducting oxide (TCO), such as an indium-doped tin oxide (ITO), a fluorine-doped tin oxide (FTO), and an antimony-doped tin oxide (ATO).

The first grid pattern 114 is used to reduce the electrical resistance of the photoelectrode 115, and functions as a collector wire that collects electrons generated by photoelectric conversion and provides a path of low-resistance current. For example, the grid pattern 114 may be formed of a metallic material having high electrical conductivity, such as gold (Au), silver (Ag), or aluminum (Al).

Referring to FIG. 1, the first grid pattern 114 may include first finger electrodes 114a and a first collector electrode 114c. The first finger electrodes 114a extend in parallel in a stripe pattern in one direction (first-axis direction $Z_1$). The first collector electrode 114c is spaced from the first finger electrodes 114a, extending in another direction (second-axis direction $Z_2$) that crosses the first-axis direction $Z_1$ of the first finger electrodes 114a, and collects electrons from the first finger electrodes 114a and discharges the electrons to the outside. For example, the first finger electrodes 114a may extend in the first-axis direction $Z_1$, and the first collector electrode 114c may extend in the second-axis direction $Z_2$ that crosses the first-axis direction $Z_1$. The collector electrode 114c may provide a terminal for accessing an external circuit, and may form an electrical contact point with the external circuit. The collector electrode 114c may be electrically connected to the counter electrode 125 via the external circuit.

The finger electrodes 114a are formed in a photoelectric conversion region surrounded by the sealing material 130, and are generally formed of an opaque material, such as metallic material. Since an aperture ratio is disproportional to the size of an area occupied by the finger electrodes 114a and the finger electrodes 114a reduce the size of an area on which light is incident, a width $W_{1a}$ of each of the finger electrodes 114a may be formed to be relatively narrow.

The collector electrode 114c may be located not to block incident light. More specifically, the collector electrode 114c may be spaced from the sealing material 130. Since the collector electrode 114c is outside the photoelectric conversion region as described above, a width $W_{1c}$ of the collector electrode 114c may be formed to be relatively wide, thereby reducing an electrical resistance of the grid pattern 114. For example, the width $W_{1c}$ of the collector electrode 114c may be wider than the widths $W_{1a}$ of the finger electrodes 114a in the photoelectric conversion region surrounded by the sealing material 130. That is, the collector electrode 114 may be designed to satisfy $W_{1a} > W_{1c}$.

The first connecting electrode 114b is between each of the first finger electrodes 114a and the first collector electrode 114c to electrically connect the first finger electrode 114a and the first collector electrode 114c. The first connecting electrodes 114b may extend in the first-axis direction $Z_1$ crossing the second-axis direction $Z_2$ in which the collector electrode 114c extends, and may be connected to the first collector electrode 114c. In one embodiment, each of the first connecting electrodes 114b does not extend straight from one end of the corresponding first finger electrode 114a, but rather extends from one end of the corresponding first finger electrode 114a toward the corresponding first collector electrode 114c to be offset in the second-axis direction $Z_2$.

The first connecting electrodes 114b are formed not to overlap the second connecting electrodes 124b of the counter substrate 120. In other words, the first connecting electrodes 114b and the second connecting electrodes 124b are connected to the first collector electrode 114c and a second collector electrode 124c alternately not to overlap one another. For example, each of the first connecting electrodes 114b and each of the second connecting electrodes 124b extend from the corresponding first finger electrode 114a and a corresponding second finger electrode 124a, respectively, to be offset with respect to each other in opposite directions along a length-wise direction (second-axis direction $Z_2$) of the first and second collector electrodes 114c and 124c. In other words, if each of the first connecting electrodes 114b extends from an end of the corresponding first finger electrode 114a to be offset in one direction, e.g., a backward direction of the second-axis direction $Z_2$, which is the direction in which the collector electrode 114c extends, then each of the second connecting electrodes 124b extends from an end of the corresponding second finger electrode 124a to be offset in the opposite direction, e.g., a forward direction of the second-axis direction $Z_2$.

A protective layer may be formed on an external surface of the first grid pattern 114. The protective layer prevents the first grid pattern 114 from corroding when the first grid pattern 114 contacts and reacts with the electrolyte layer 150. The protective layer may be formed of a material that does not react with the electrolyte layer 150, e.g., a curable resin material.

The semiconductor layer 117 may be formed of a metal oxide, e.g., cadmium (Cd), zinc (Zn), indium (In), lead (Pb), molybdenum (Mo), tungsten (W), antimony (Sb), titanium (Ti), silver (Ag), manganese (Mn), tin (Sn), zirconium (Zr), strontium (Sr), gallium (Ga), silicon (Si), or chromium (Cr). The semiconductor layer 117 may increase the photoelectric conversion efficiency by adsorbing the photosensitive dye. For example, the semiconductor layer 117 may be formed by coating a paste of semiconductor particles having a particle diameter of about 5 nm to about 1000 nm on the light-receiving substrate 110 on which the photoelectrode 115 is formed and applying heat or pressure to the resultant structure.

The photosensitive dye adsorbed to the semiconductor layer 117 absorbs light incident through the light-receiving substrate 110, and the electrons of the photosensitive dye are excited from a ground state. The excited electrons are transferred to the conduction band of the semiconductor layer 117 through electrical contacting the photosensitive dye and the semiconductor layer 117, pass the semiconductor layer 117 to reach the photoelectrode 115, and are discharged to the outside through the photoelectrode 115, thereby forming a driving current for driving the external circuit.

The semiconductor layer 117 may be formed on the transparent conductive layer 111 between the finger electrodes 114a. The electrons discharged from the semiconductor layer 117 move to the finger electrodes 114a via the transparent conductive layer 111 that is electrically connected to the semiconductor layer 117, and may be discharged to the outside via the collector electrode 114c that collects the electrons from the finger electrodes 114a.

For example, the photosensitive dye adsorbed to the semiconductor layer 117 may consist of molecules that absorb visible light and excite electrons so as to allow the excited electrons to rapidly move to the semiconductor layer 117. The photosensitive dye may be any one of liquid type, semi-solid gel type, and solid type photosensitive dyes. For example, the photosensitive dye adsorbed to the semiconductor layer 117 may be a ruthenium-based photosensitive dye. The semiconductor layer 117 adsorbing the photosensitive dye may be obtained by dipping the light-receiving substrate 110 on which the semiconductor layer 117 is formed in a solution containing the photosensitive dye.

The electrolyte layer 150 may be formed of a redox electrolyte including reduced/oxidized (R/O) couples. The electrolyte layer 150 may be formed of any one of solid type, gel type, and liquid type electrolytes.

The counter substrate 120 facing the light-receiving substrate 110 is not necessarily transparent. However, in order to increase the photoelectric conversion efficiency, the counter substrate 120 may be formed of a transparent material in such a manner that the photoelectric conversion device may receive light on both sides thereof, and may be formed of the same material as that of the light-receiving substrate 110. In particular, if the photoelectric conversion device is installed as a building integrated photovoltaic (BIPV) system in a structure, e.g., a window frame, both sides of the photoelectric conversion device may be transparent so that light introduced into the inside of a building is not blocked.

The counter electrode 125 may function as a positive electrode of the photoelectric conversion device, and may also function as a reduction catalyst for providing electrons to the electrolyte layer 150. The photosensitive dye adsorbed to the semiconductor layer 117 absorbs light to excite electrons, and the excited electrons are discharged to the outside via the photoelectrode 115. The photosensitive dye that loses the electrons receives electrons generated by oxidization of the electrolyte layer 150 to be reduced again, and the oxidized electrolyte layer 150 is reduced again by electrons passing through the external circuit and reaching the counter electrode 125, thereby completing the operation of the photoelectric conversion device.

More specifically, the counter electrode 125 may include a transparent conductive layer 121, a catalyst layer 122 on the transparent conductive layer 121, and a second grid pattern 124 on the catalyst layer 122. The transparent conductive layer 121 is formed of a material having transparency and electrical conductivity, e.g., a TCO, such as an ITO, an FTO, or an ATO. The catalyst layer 122 is formed of a reduction catalyzing material for providing electrons to the electrolyte layer 150, e.g., metal, such as Pt, Au, Ag, Cu, or Al, a metal oxide, such as a tin oxide, or a carbon-based material, such as graphite.

The second grid pattern 124 may be used to reduce the electrical resistance of the counter electrode 125, and may function as a collector wire that collects electrons received via the external circuit and provides a path of low-resistance current. For example, the grid pattern 124 may be formed of a metallic material having high electrical conductivity, such as gold (Au), silver (Ag), or aluminum (Al).

The second grid pattern 124 may include the second finger electrodes 124a and the second collector electrode 124c. The second finger electrodes 124a extend in parallel in a stripe pattern in one direction (first-axis direction $Z_1$). The second collector electrode 124c is spaced from the second finger electrodes 124a, extending in another direction (second-axis direction $Z_2$) that crosses the second finger electrodes 124a. For example, the second finger electrodes 124a may extend in the first-axis direction $Z_1$, and the second collector electrode 124c may extend in the second-axis direction $Z_2$ crossing the first-axis direction $Z_1$. The second collector electrode 124c may provide a terminal for electrically accessing the external circuit, and may form an electrical contact point with the external circuit. The second collector electrode 124c may be electrically connected to the photoelectrode 114 via the external circuit.

The second finger electrodes 124a may block incident light since they are formed in the photoelectric conversion region surrounded by the sealing material 130 and are formed of an opaque material, such as a metallic material. Thus, a width $W_{2a}$ of each of the second finger electrodes 124a may be formed to be relatively narrow. However, since the second collector electrode 124c is formed outside the photoelectric conversion region, i.e., on a location that does not block incident light, a width $W_{2c}$ of the second collector electrode 124c may be determined to be relatively wide, thereby reducing electrical resistance thereof. For example, the width $W_{2c}$ of the second collector electrode 124c may be wider than the width $W_{2a}$ of each of the second finger electrodes 124a, i.e., $W_{2c} > W_{2a}$.

The second connecting electrode 124b is formed between the second finger electrodes 124a and the second collector electrode 124c to electrically connect the second finger electrodes 124a and the second collector electrode 124c. The second connecting electrodes 124b and the first connecting electrodes 114b of the light-receiving substrate 110 are disposed alternately not to overlap one another. For example, each of the second connecting electrodes 124b may extend toward the second collector electrode 124c from an end of the corresponding second finger electrode 124a to be offset from the corresponding second finger electrode 124a with respect to each other in the second-axis direction $Z_2$.

The second connecting electrodes 124b of the counter substrate 120 are formed not to overlap the first connecting electrodes 114b of the light-receiving substrate 110, respectively. In other words, the first and second connecting electrodes 114b and 124b are formed alternately in such a manner that the first and second connecting electrodes 114b and 124b do not overlap one another to be connected to the first and second collector electrodes 114c and 124c, respectively. For example, each of the first connecting electrodes 114b extends from the corresponding first finger electrode 114a and each of the second connecting electrodes 124b extends from the corresponding second finger electrode 124a to be offset with respect to each other in opposite directions along the lengthwise direction (second-axis direction $Z_2$) of the first and second collector electrodes 114c and 124c. For example, if the first connecting electrode 114b extends from an end of each of the first finger electrodes 114a to be offset in one direction, e.g., the backward direction of the second-axis direction $Z_2$ in which the first collector electrode 114c extends, then each of the second connecting electrodes 124b extends from an end of the corresponding second finger electrode 124a to be offset in the opposite direction, e.g., the forward direction of the second-axis direction $Z_2$.

When the first and second connecting electrodes 114b and 124b are oriented alternately not to overlap one another as described above, it is possible to prevent the formation of a light-blocking region by receiving light via both surfaces of the photoelectric conversion device, i.e., the light-receiving substrate 110 and the counter substrate 120. For example, a pattern may be formed using exposure so as to form a multi-layered structure of the photoelectric conversion device. However, light incident through the light-receiving substrate 110 does not reach the light-blocking regions covered by the first connecting electrodes 114b of the light-receiving substrate 110, and light incident through the counter substrate 120 does not reach the light-blocking regions covered by the second connecting electrodes 124b of the counter substrate 120. In this case, the light-blocking regions may be prevented from being formed below the first and second connecting electrodes 114b and 124b by arranging the first and second connecting electrodes 114b and 124b alternately not to overlap one another and performing exposure on both the light-receiving substrate 110 and the counter substrate 120.

The sealing material 130 sealing the photoelectric conversion device may be thermally fused between the light-receiving substrate 110 and the counter substrate 120 by laser. During the sealing of the photoelectric conversion device, laser beams may be irradiated on the sealing material 130 located between the light-receiving substrate 110 and the counter substrate 120 to join the light-receiving substrate 110 and the counter substrate 120 together via the sealing material 130. In this case, laser beams cannot reach the light-blocking regions covered by the second connecting electrodes 124b of the counter substrate 120 by irradiating laser beams on the counter substrate 120. Thus, laser beams may be directly irradiated on the light-blocking regions covered by the second connecting electrodes 124b by irradiating the laser beams on the light-receiving substrate 110 opposite to the counter substrate 120. As described above, it is possible to appropriately fuse the sealing material 130 by irradiating laser beams on the light-receiving substrate 110 and the counter substrate 120, which are the two surfaces of the photoelectric conversion device, thereby improving sealing quality.

Figure 4:
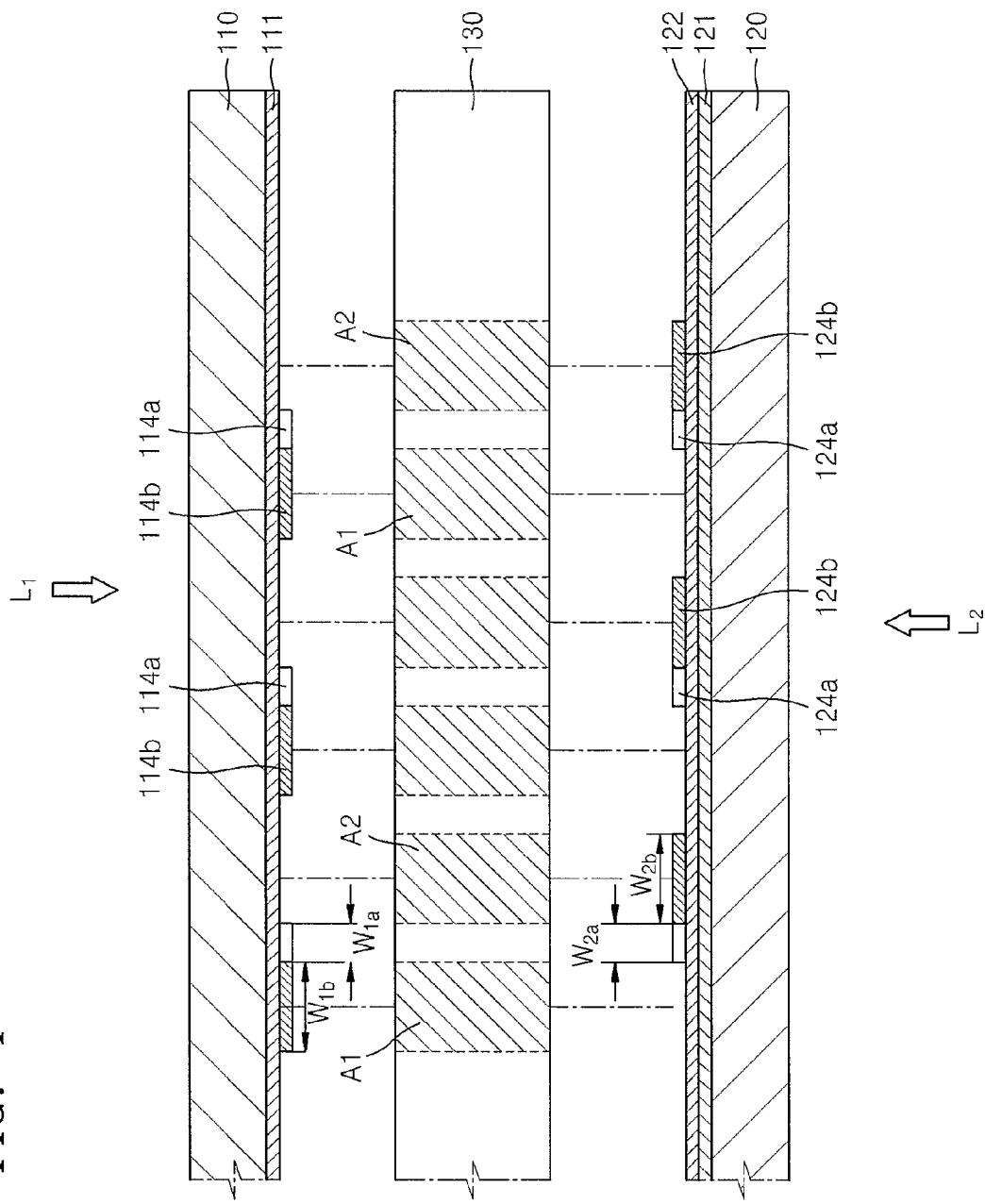
FIG. 4 is a cross-sectional view taken along the line IV-IV of FIG. 1.

FIG. 4 is a cross-sectional view taken along the line IV-IV of FIG. 1. The sealing material 130 may be fixed between the light-receiving substrate 110 and the counter substrate 120 by using the external energy source. For example, the sealing material 130 may be fused between the light-receiving substrate 110 and the counter substrate 120 by a laser. In detail, during sealing of the photoelectric conversion device, the light-receiving substrate 110 and the counter substrate 120 face each other having the sealing material 130 therebetween, and laser irradiation is performed on the sealing material 130. In this case, if first laser beams L1 are irradiated on the light-receiving substrate 110, an amount of heat sufficient to fuse the sealing material 130 may not be transferred to first light-blocking regions A1 respectively covered by the first connecting electrodes 114b. Thus, second laser beams L2 may be directly transferred to the first light-blocking regions A1 by irradiating the second laser beams L2 on the counter substrate 120 opposite to the light-receiving substrate 110. Likewise, since the second laser beams L2 are not directly transferred to second light-blocking regions A2 respectively covered by the second connecting electrode 124b by irradiating the second laser beams L2 on the counter substrate 120, the laser beams L1 may be applied to the second light-blocking regions A2 via the light-receiving substrate 110. As described above, the sealing material 130 may be appropriately fused by irradiating laser beams on the light-receiving substrate 110 and the counter substrate 120, thereby improving sealing quality.

More specifically, the first laser beams L1 irradiated on the light-receiving substrate 110 cannot reach the first light-blocking regions A1 formed right below and covered by the first connecting electrodes 114b. However, the second lasers L2 irradiated on the counter substrate 120 may reach the first light-blocking regions A1 via the second connecting electrodes 124b that are formed together with the first connecting electrodes 114b alternately. Likewise, the second laser beams L2 irradiated on the counter substrate 120 cannot reach the second light-blocking regions A2 formed right below and covered by the second connecting electrodes 124b, but the first laser beams L1 irradiated on the light-receiving substrate 110 may reach the second light-blocking regions A2 via the first connecting electrodes 114b that are formed together with the second connecting electrodes 124b alternately.

In conclusion, the first and second connecting electrodes 114b and 124b are arranged alternately not to overlap one another so that laser beams may be applied to the entire sealing material 130 by irradiating the laser beams on the light-receiving substrate 110 and counter substrate 120, which are the two surfaces of the photoelectric conversion device. If the first and second connecting electrodes 114b and 124b are arranged to overlap one another, laser beams cannot reach regions formed by overlapping of the first and second connecting electrodes 114b and 124b even when the laser beams are irradiated in both directions.

The arrangement of the first and second connecting electrodes 114b and 124b will now be described in detail with reference to FIG. 3. Each of the first connecting electrodes 114b does not extend straight from an end of the corresponding first finger electrode 114a and each of the second connecting electrodes 124b does not extend straight from an end of the corresponding second finger electrode 124a. Instead, each of the first connecting electrodes 114b extends toward the first collector electrode 114c from an end of the corresponding first finger electrode 114a and each of the second connecting electrodes 124b extends toward the second collector electrode 124c from an end of the corresponding second finger electrode 124a to be offset with respect to each other in opposite directions. A first contact point $P_1$ between the first connecting electrodes 114b and the first collector electrode 114c and a second contact point $P_2$ between the second connecting electrodes 114b and the second collector electrode 114c are spaced from each other in the length-wise direction (second-axis direction $Z_2$) of the first and second collector electrodes 114c and 124c. The first and second contact points $P_1$ and $P_2$ are located at opposite sides in a second axis direction $Z_2$ with respect to a central line C of the first and second finger electrodes 114a and 124a. For example, the first contact point $P_1$ may be located to be offset in the backward direction of the second-axis direction $Z_2$ from the central line C, and the second contact point $P_2$ may be located to be offset in the forward direction of the second-axis direction $Z_2$ from the central line C.

The first finger electrodes 114a of the light-receiving substrate 110 and the second finger electrodes 124a of the counter substrate 120 may be aligned with one another to overlap one another. The first and second finger electrodes 114a and 124a may be formed of an opaque material, such as a metallic material, and may be in the photoelectric conversion region surrounded by the sealing material 130. Thus, the aperture ratio of light incident on surfaces of the light-receiving substrate 110 and the counter substrate 120 may be increased by aligning the first and second finger electrodes 114a and 124a with one another. In particular, if the photoelectric conversion efficiency is increased using light incident on surfaces of the light-receiving substrate 110 and the counter substrate 120, the first and second finger electrodes 114a and 124a may be aligned with one another. In contrast, when the first and second finger electrodes 114a and 124a are alternately formed on different locations, the aperture ratio of light incident on surfaces of the light-receiving substrate 110 and the counter substrate 120 decreases.

Referring back to FIG. 1, the widths $W_{1b}$ and $W_{2b}$ of the first and second connecting electrodes 114b and 124b may be formed to be relatively wide. For example, the first and second connecting electrodes 114b and 124b are connected to the first and second collector electrodes 114c and 124c from the first and second finger electrodes 114a and 124a, respectively, not in a straight, shortest path. Thus, since a path of current generated due to photoelectric conversion may be relatively long, the widths $W_{1b}$ and $W_{2b}$ of the first and second connecting electrodes 114b and 124b may be formed to be relatively wide, thereby compensating for an increase in electrical resistance. That is, the widths $W_{1b}$ and $W_{2b}$ of the first and second connecting electrodes 114b and 124b may be formed to be wider than the widths $W_{1a}$ and $W_{2a}$ of the first and second finger electrodes 114a and 124a formed to be relatively narrow in consideration of the aperture ratio of light.

Figure 5:
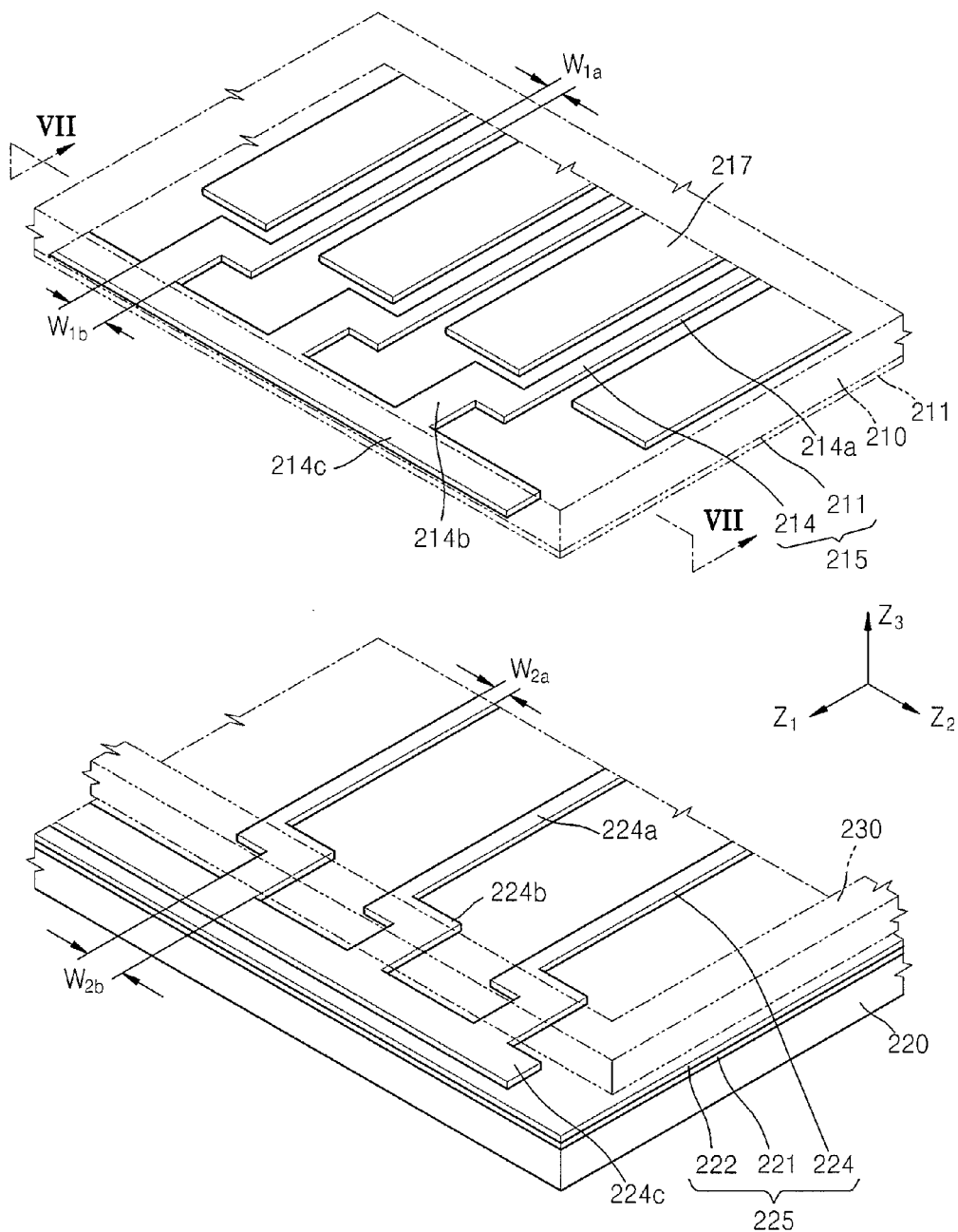
FIG. 5 is an exploded perspective view of a photoelectric conversion device according to another embodiment of the present invention.

FIG. 5 is an exploded perspective view of a photoelectric conversion device according to another embodiment of the present invention. Referring to FIG. 5, a light-receiving substrate 210 having a photoelectrode 215 and a counter substrate 220 having a counter electrode 225 face each other, and the light-receiving substrate 210 and the counter substrate 220 are sealed together by using a sealing material 230 located between the light-receiving substrate 210 and the counter substrate 220.

The photoelectrode 215 may include a transparent conductive layer 211 formed on the light-receiving substrate 210, and a first grid pattern 214 formed on the transparent conductive layer 211. A semiconductor layer 217 adsorbing a photosensitive dye excited by light may be formed on the transparent conductive layer 211 and adjacent to the first grid pattern 214. The first grid pattern 214 includes a plurality of first finger electrodes 214a that extend in parallel in a first-axis direction $Z_1$, and a first collector electrode 214c that is spaced from the first finger electrodes 214a and extends in a second-axis direction $Z_2$, which crosses the first finger electrodes 214a. The first grid pattern 214 further includes a plurality of first connecting electrodes 214b that electrically connect the first finger electrodes 214a to the first collector electrode 214c, respectively.

The counter electrode 225 facing the photoelectrode 215 may include a transparent conductive layer 221, a catalyst layer 222 formed on the transparent conductive layer 221, and a second grid pattern 224 formed on the catalyst layer 222. The second grid pattern 224 includes a plurality of second finger electrodes 224a that extend in parallel in the first-axis direction $Z_1$, and a second collector electrode 224c that is spaced from the second finger electrodes 224a and extends in the second-axis direction $Z_2$ that crosses the second finger electrodes 224a. The second grid pattern 224 further includes second connecting electrodes 224b that electrically connect the second finger electrodes 225a and the second collector electrode 224c.

The first and second connecting electrodes 214b and 224b are arranged alternately not to overlap one another. That is, the first and second connecting electrodes 214b and 224b are connected to the first and second collector electrodes 214c and 224c, not in a straight, short path but in a bent path, and not to overlap one another, e.g., to be offset in opposite directions.

For example, each of the first connecting electrodes 214b extends from an end of the corresponding first finger electrode 214a to be bent in the backward direction of the second-axis direction $Z_2$, and each of the second connecting electrodes 224b extends from an end of the corresponding second finger electrode 224a to be bent in the forward direction of the second-axis direction $Z_2$. When the first and second connecting electrodes 214b and 224b are aligned with one another alternately as described above, light may be irradiated on both the light-receiving substrate 210 and the counter substrate 220, thereby preventing formation of light-blocking regions.

Figure 6:
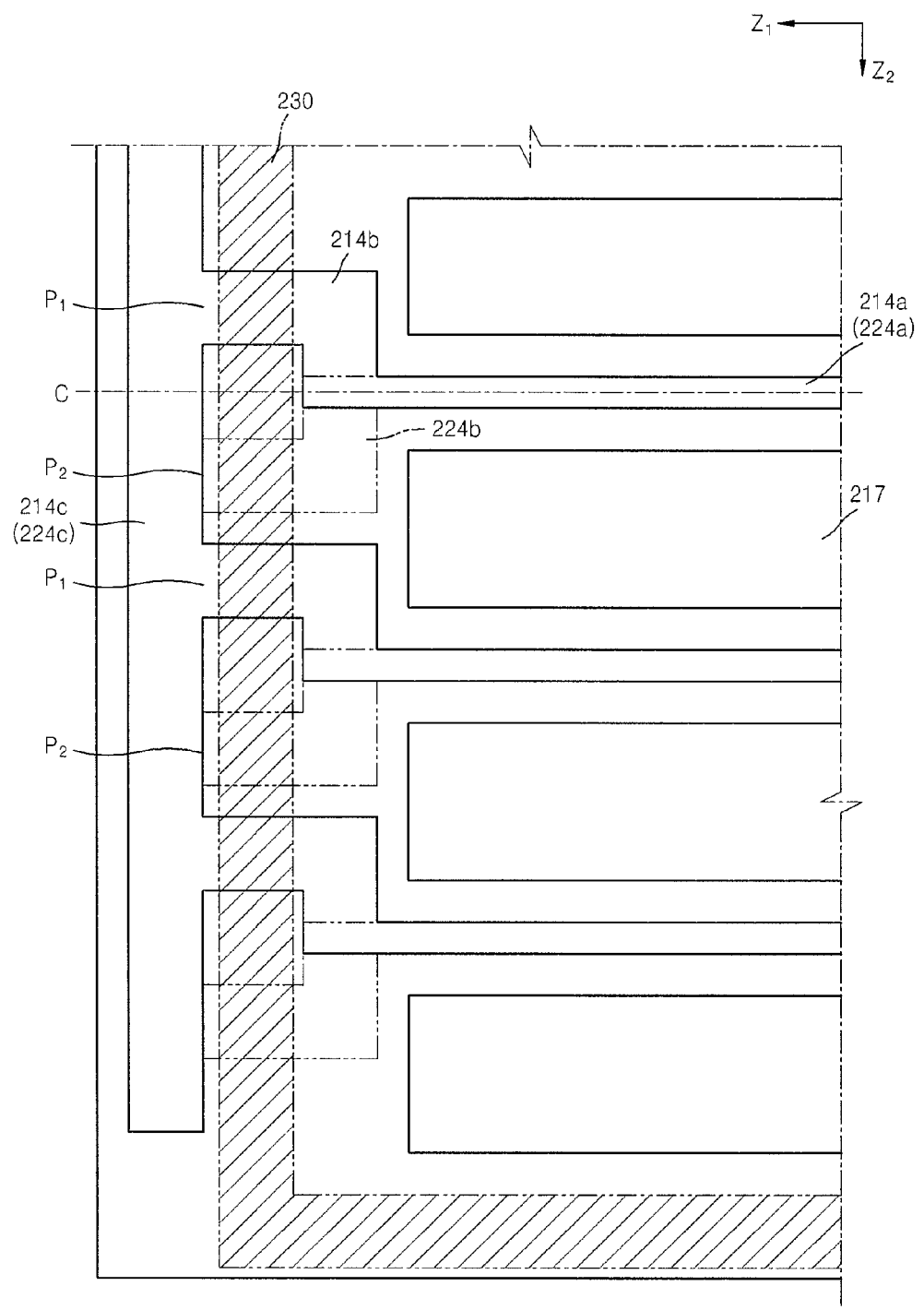
FIG. 6 is a layout diagram of first and second connecting electrodes illustrated in FIG. 5.

FIG. 6 is a layout diagram of the first and second connecting electrodes 214b and 224b illustrated in FIG. 5. Referring to FIG. 6, the first and second connecting electrodes 214b and 224b do not extend straight from the corresponding first and second finger electrodes 214a and 224a, but rather extend from the corresponding first and second finger electrodes 214a and 224a to be bent in opposite directions.

First contact points $P_1$ between the first connecting electrodes 214b and the first collector electrode 214c and second contact points $P_2$ between the second connecting electrodes 224b and the second collector electrode 224c, are located spaced from one another in a length-wise direction (second-axis direction $Z_2$) of the first and second collector electrodes 214c and 224c. In detail, the first and second contact points $P_1$ and $P_2$ are located at opposite sides with respect to a central line C of the first and second finger electrodes 214a and 224a. For example, the first contact point $P_1$ may be located to be offset in the backward direction of the second-axis direction $Z_2$ from the central line C, and the second contact point $P_2$ may be located to be offset in the forward direction of the second-axis direction $Z_2$ from the central line C.

The first and second finger electrodes 214a and 224a may be aligned with one another to overlap one another. The first and second finger electrodes 214a and 224a may be formed of an opaque material, e.g., a metallic material, and may be in a photoelectric conversion region surrounded by the sealing material 230. Thus, the aperture ratio of light incident on the light-receiving substrate 210 and the counter substrate 220 may be increased by aligning the first and second finger electrodes 214a and 224a with one another. Also, the photoelectric conversion efficiency may be increased by performing photoelectric conversion by using light incident on the light-receiving substrate 210 and the counter substrate 220.

Referring back to FIG. 5, widths $W_{1b}$ and $W_{2b}$ of the first and second connecting electrodes 214a and 224a may be formed to be relatively wide. The first and second connecting electrodes 214b and 224b are connected to the first and second collector electrodes 214c and 224c from ends of the first and second finger electrodes 214a and 224a, respectively, not in a straight, shortest path, but rather in a bent path. Thus, since a path of current generated due to photoelectric conversion is longer the widths $W_{1b}$ and $W_{2b}$ of the first and second connecting electrodes 214b and 224b may be formed to be relatively wide, thereby compensating for an increase in electrical resistance. For example, the widths $W_{1b}$ and $W_{2b}$ of the first and second connecting electrodes 214b and 224b may be formed to be wider than widths $W_{1a}$ and $W_{2a}$ of the first and second finger electrodes 214a and 224a formed to be relatively narrow in consideration of the aperture ratio of light.

Figure 7:
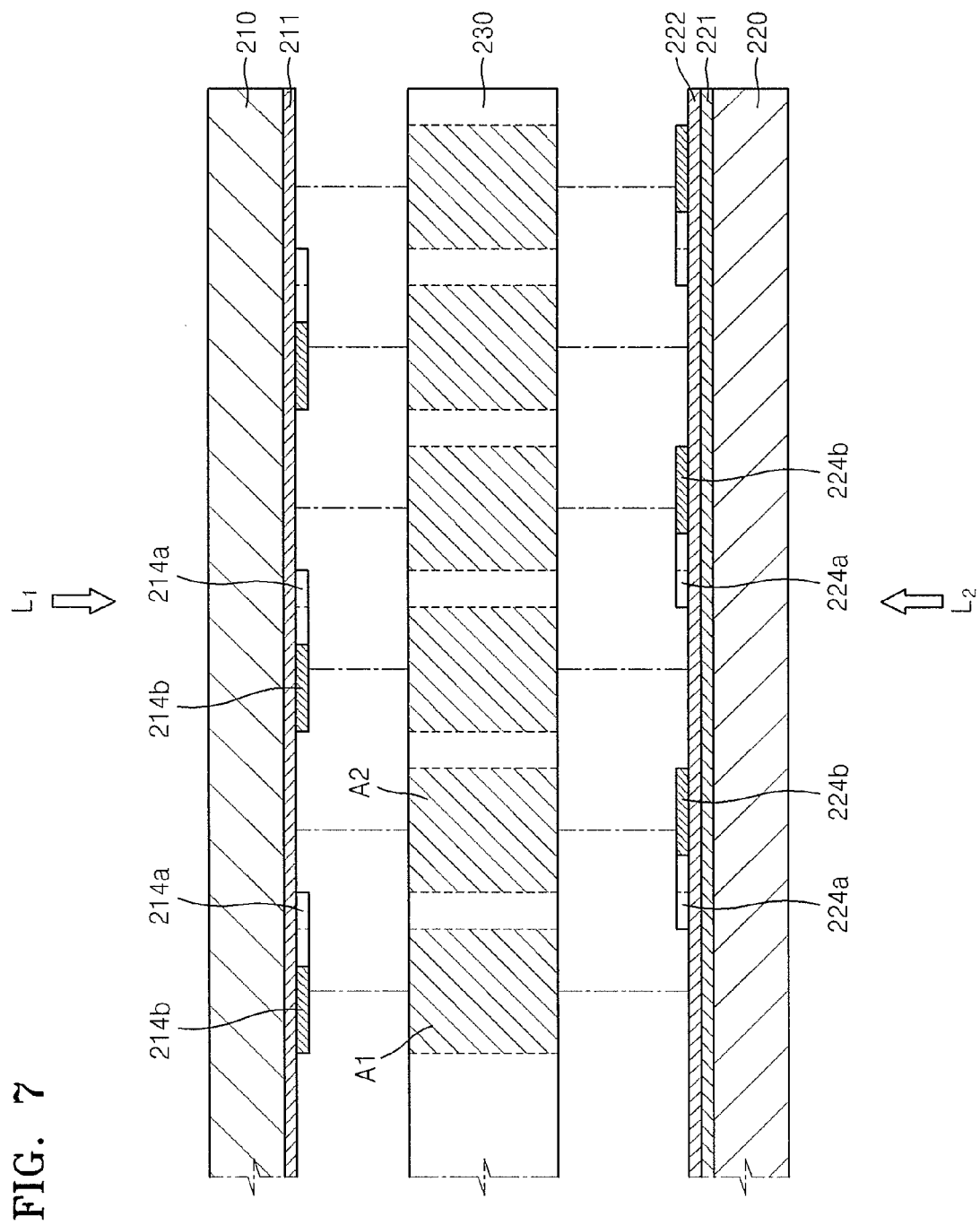
FIG. 7 is a cross-sectional view taken along the line VII-VII of FIG. 5.

FIG. 7 is a cross-sectional view taken along the line VII-VII of FIG. 5. During sealing of the light-receiving substrate 210 and the counter substrate 220, the light-receiving substrate 210 and the counter substrate 220 may be joined together to face each other by fusing the sealing material 230 between the light-receiving substrate 210 and the counter substrate 220 by using an external energy source. For example, the sealing material 230 may be fused between the light-receiving substrate 210 and the counter substrate 220 by a laser. Thus, first laser beams L1 irradiated on the light-receiving substrate 210 cannot reach first light-blocking regions A1 formed right below and covered by the first connecting electrodes 214b. However, second laser beams L2 irradiated on the counter substrate 220 may reach the first light-blocking regions A1 via the second connecting electrodes 224b that are formed together with the first connecting electrodes 214b alternately. Likewise, the second laser beams L2 irradiated on the counter substrate 220 cannot reach second light-blocking regions A2 formed right below and covered by the second connecting electrodes 224b, but the first laser beams L1 irradiated on the light-receiving substrate 210 may reach the second light-blocking regions A2 via the first connecting electrodes 214b that are formed together with the second connecting electrodes 224b alternately.

In conclusion, the first and second connecting electrodes 214b and 224b are aligned with one another not to overlap one another so that laser beams may reach the entire sealing material 230 by irradiating the laser beams on both the light-receiving substrate 210 and the counter substrate 220. However, if the first and second connecting electrodes 214b and 224b are arranged to overlap one another, laser beams cannot reach regions formed due to the overlapping of the first and second connecting electrodes 214b and 224b even if the laser beams are irradiated in both directions.

A method of manufacturing a photoelectric conversion device, according to an embodiment of the present invention, will now be described with reference to FIGS. 1 to 4. First, the light-receiving substrate 110 having the photoelectrode 115 thereon and the counter substrate 120 having the counter electrode 125 thereon are prepared. More specifically, the transparent conductive layer 111 and the first grid pattern 114 are formed on the light-receiving substrate 110, and the semiconductor layer 117 being electrically connected to the photoelectrode 115 is formed on the resultant structure. Next, the transparent conductive layer 121, the catalyst layer 122, and the second grid pattern 124 are formed on the counter substrate 120. These layers, namely, the photoelectrode 115, the semiconductor layer 117, and counter electrode 125 of the light-receiving substrate 110 and the counter substrate 120, may be formed according to an appropriate film formation process, e.g., photolithography, screen printing, or sputtering.

During formation of the first and second grid patterns 114 and 124 the first and second finger electrodes 114a and 124a may be formed extending in parallel in the first-axis direction $Z_1$, and the first and second collector electrodes 114c and 124c may be formed to be spaced from the first and second finger electrodes 114a and 124a and extend in the second-axis direction $Z_2$ that crosses the first and second finger electrodes 114a and 124a. Furthermore, first and second connecting electrodes 114b and 124b may be formed to electrically connect the first and second finger electrodes 114a and 124a to the first and second collector electrodes 114c and 124c, respectively. The first and second finger electrodes 114a and 124a, the first and second connecting electrodes 114b and 124b, and the first and second collector electrodes 114c and 124c may be formed on an appropriate underlying layer, e.g., the transparent conductive layer 111 or the catalyst layer 122, simultaneously and as one body. In this case, the first and second connecting electrodes 114b and 124b may be arranged alternately not to overlap one another. For example, the first and second connecting electrodes 114b and 124b may extend toward the first and second collector electrodes 114c and 124c from ends of the first and second finger electrodes 114a and 124a, respectively, to be offset with respect to the first and second finger electrodes 114a and 124a in opposite directions. An electrolyte injection aperture may be formed in at least one from among the light-receiving substrate 110 and the counter substrate 120.

Next, the light-receiving substrate 110 and the counter substrate 120 facing each other, and the sealing material 130 is applied along edges between the light-receiving substrate 110 and the counter substrate 120. For example, the sealing material 130, e.g., a glass frit paste containing a laser-absorbing material, may be applied along edges of the light-receiving substrate 110. Then, the first laser beams L1 (see FIG. 4) may be irradiated on the light-receiving substrate 110 in one direction, and the second laser beams L2 (see FIG. 4) may be irradiated on the counter substrate 120 in another direction, thereby fusing the sealing material 130 between the light-receiving substrate 110 and the counter substrate 120.

If the first and second connecting electrodes 114b and 124b are arranged alternately and the first and second laser beams L1 and L2 are irradiated on the light-receiving substrate 110 and the counter substrate 120, then the sealing material 130 may fixedly attached between the light-receiving substrate 110 and the counter substrate 12, thereby improving the sealing quality of the sealing material 130.

Thereafter, the electrolyte layer 150 of FIG. 2 is implanted into the resultant structure via the electrolyte injection aperture. For example, the electrolyte injection aperture may be formed in at least one from among the light-receiving substrate 110 and the counter substrate 120. After the implantation of the electrolyte layer 150 is completed, the photoelectric conversion device is completed by sealing the electrolyte injection aperture.

As described above, according to the one or more of the above embodiments of the present invention, electrodes formed on substrates of a photoelectric conversion device are arranged alternately not to overlap one another. Accordingly, light-blocking regions blocking light, e.g., laser beams, which are irradiated on the first and second substrates, may be prevented from being formed during the manufacture of the photoelectric conversion device. For example, since light-blocking regions covered by electrodes may be prevented from being formed, it is possible to appropriately fuse a sealing material by laser to seal between the first and second substrates, thereby improving the sealing quality of the photoelectric conversion device.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A photoelectric conversion device comprising:
   a first substrate;
   a second substrate located generally opposite to the first substrate;
   a first grid pattern located on the first substrate, wherein the first grid pattern comprises:
      a first finger electrode;
      a first collector electrode spaced from the first finger electrode and extending in a direction that intersects the first finger electrode; and
      a first connecting electrode connecting the first finger electrode and the first collector electrode; and
   a second grid pattern located on the second substrate, wherein the second grid pattern comprises:
      a second finger electrode;
      a second collector electrode spaced from the second finger electrode and extending in a direction that intersects the second finger electrode; and
      a second connecting electrode connecting the second finger electrode and the second collector electrode,
   wherein the first connecting electrode and the second connecting electrode are arranged alternately and do not overlap each other.

2. The photoelectric conversion device of claim 1, wherein the first finger electrode and the second finger electrode extend in a first direction along a first axis,
   wherein the first collector electrode and the second collector electrode extend along a second direction along a second axis that intersects the first axis, and
   wherein the first connecting electrode and the second connecting electrode extend in the first direction to be connected to the first collector electrode and the second collector electrode, respectively.

3. The photoelectric conversion device of claim 2, wherein the first connecting electrode and the second connecting electrode extend from the first finger electrode and the second finger electrode, respectively, to be offset with respect to each other along the second axis.

4. The photoelectric conversion device of claim 2, wherein the first connecting electrode and the second connecting electrode bend from the first finger electrode and the second finger electrode, respectively, to be offset with respect to each other along the second axis.

5. The photoelectric conversion device of claim 2, wherein a first contact point between the first connecting electrode and the first collector electrode and a second contact point between the second connecting electrode and the second collector electrode are located on different locations along the second axis.

6. The photoelectric conversion device of claim 1, wherein the first finger electrode and the second finger electrode are aligned with each other to overlap each other.

7. The photoelectric conversion device of claim 1, wherein the first connecting electrode and the second connecting electrode are wider than the first finger electrode and the second finger electrode, respectively.

8. The photoelectric conversion device of claim 1, wherein the first collector electrode and second collector electrode are wider than the first finger electrode and the second finger electrode, respectively.

9. The photoelectric conversion device of claim 1, further comprising a sealing material extending across the first connecting electrode and the second connecting electrode to seal between the first substrate and the second substrate.

10. The photoelectric conversion device of claim 9, wherein the first finger electrode and the second finger electrode are located in a photoelectric conversion region surrounded by the sealing material.

11. The photoelectric conversion device of claim 9, wherein the first collector electrode and the second collector electrode are formed outside a photoelectric conversion region surrounded by the sealing material.

12. The photoelectric conversion device of claim 9, wherein the sealing material comprises a laser-absorbing material.

* * * * *

UNITED STATES PATENT AND TRADEMARK OFFICE
CERTIFICATE OF CORRECTION

| | | |
|---|---|---|
| PATENT NO. | : 8,592,678 B2 | Page 1 of 1 |
| APPLICATION NO. | : 13/239300 | |
| DATED | : November 26, 2013 | |
| INVENTOR(S) | : Do-Young Park | |

It is certified that error appears in the above-identified patent and that said Letters Patent is hereby corrected as shown below:

In the Claims

Column 15, Claim 8, line 6     After "and"

Insert -- the --

Signed and Sealed this
Seventh Day of July, 2015

Michelle K. Lee
*Director of the United States Patent and Trademark Office*